(12) United States Patent
Huang et al.

(10) Patent No.: US 9,847,247 B2
(45) Date of Patent: Dec. 19, 2017

(54) METHOD FOR FILLING GAPS OF SEMICONDUCTOR DEVICE AND SEMICONDUCTOR DEVICE FORMED BY THE SAME

(71) Applicant: UNITED MICROELECTRONICS CORP., Hsinchu (TW)

(72) Inventors: Ping-Wei Huang, Pingtung County (TW); Keng-Jen Lin, Kaohsiung (TW); Yi-Hui Lin, Changhua County (TW); Yu-Ren Wang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/590,114

(22) Filed: May 9, 2017

(65) Prior Publication Data

US 2017/0243780 A1 Aug. 24, 2017

Related U.S. Application Data

(62) Division of application No. 14/805,639, filed on Jul. 22, 2015, now Pat. No. 9,685,319.

(30) Foreign Application Priority Data

Jun. 15, 2015 (CN) .......................... 2015 1 0325871

(51) Int. Cl.
*H01L 29/06* (2006.01)
*H01L 21/762* (2006.01)

(52) U.S. Cl.
CPC .............................. *H01L 21/76224* (2013.01)

(58) Field of Classification Search
CPC ...... B82Y 10/00; B82Y 25/00; G01R 33/093; G01R 33/307; G01R 33/31; G01R 33/34023; G01R 33/3403; G01R 33/34061; G01R 33/34092; G01R 33/3415; G11B 2005/3996; G11B 5/3932; G11B 5/66; G11B 5/3906
See application file for complete search history.

(56) References Cited

U.S. PATENT DOCUMENTS

| | | | |
|---|---|---|---|
| 2005/0020027 A1* | 1/2005 | Lim .................. | H01L 21/76224 438/437 |
| 2012/0034783 A1 | 2/2012 | Entalai et al. | |
| 2012/0276713 A1* | 11/2012 | Miyahara .......... | H01L 21/76224 438/427 |
| 2014/0374838 A1* | 12/2014 | Chen .................. | H01L 27/0886 257/401 |
| 2015/0064929 A1* | 3/2015 | Tseng ................ | H01L 29/66795 438/762 |
| 2015/0155360 A1* | 6/2015 | Kim .................. | H01L 21/28282 257/314 |

* cited by examiner

*Primary Examiner* — Robert Bachner
(74) *Attorney, Agent, or Firm* — WPAT, PC

(57) ABSTRACT

A method for filling gaps of semiconductor device and a semiconductor device with insulation gaps formed by the same are provided. First, a silicon substrate with plural protruding portions is provided, and the protruding portions are spaced apart from each other by gaps with predetermined depths. A nitride-containing layer is formed above the silicon substrate for covering the protruding portions and surfaces of the gaps as a liner nitride. Then, an amorphous silicon layer is formed on the nitride-containing layer. An insulating layer is formed on the amorphous silicon layer, and the gaps are filled up with the insulating layer.

13 Claims, 5 Drawing Sheets

METHOD FOR FILLING GAPS OF SEMICONDUCTOR DEVICE AND SEMICONDUCTOR DEVICE FORMED BY THE SAME

CROSS REFERENCE TO RELATED APPLICATIONS

This application is a Divisional of U.S. patent application Ser. No. 14/805,639, filed Jul. 22, 2015 (now allowed) and entitled "METHOD FOR FILLING GAPS OF SEMICONDUCTOR DEVICE AND SEMICONDUCTOR DEVICE FORMED BY THE SAME", which claims the benefit of People's Republic of China application Serial No. 201510325871.5, filed Jun. 15, 2015, the contents of which are incorporated herein by reference herein.

BACKGROUND

Technical Field

The disclosure relates in general to a method for manufacturing a semiconductor device and a semiconductor device formed by the same, and more particularly to a method for filling gaps of semiconductor device and a semiconductor device with insulation gaps formed by the same.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications.

Generally, the shrinking size of the semiconductor device increases the aspect ratio of the gaps (or trenches) formed in the pattern, thereby increasing the difficulty of gap filling. Whether the layers and portions of the semiconductor device after gap filling have complete configurations and not-deteriorated properties, such as silicon consumption of the fins (may result in loss of fin diameter) in a FinFET device and bending fins, would be the concerns of the manufacturers.

SUMMARY

The disclosure is directed to a method for filling gaps of semiconductor device and a semiconductor device with insulation gaps formed by the same, which significantly improve the electrical characteristics and lifespan of the device.

According to the present disclosure, a method for filling gaps of semiconductor device is provided. First, a silicon substrate with plural protruding portions is provided, and the protruding portions are spaced apart from each other by gaps with predetermined depths. A nitride-containing layer is formed above the silicon substrate for covering the protruding portions and surfaces of the gaps as a liner nitride. Then, an amorphous silicon layer is formed on the nitride-containing layer. An insulating layer is formed on the amorphous silicon layer, and the gaps are filled up with the insulating layer.

According to the present disclosure, a semiconductor device with insulation gaps is provided, comprising a silicon substrate with plural protruding portions which are spaced apart from each other by gaps with predetermined depths, a nitride-containing layer formed above the silicon substrate for covering the protruding portions and surfaces of the gaps as a liner nitride, an amorphous silicon layer formed on the nitride-containing layer, and an insulating layer formed on the amorphous silicon layer and filling up the gaps.

The disclosure will become apparent from the following detailed description of the preferred but non-limiting embodiments. The following description is made with reference to the accompanying drawings.

DETAILED DESCRIPTION

Figure 1A:
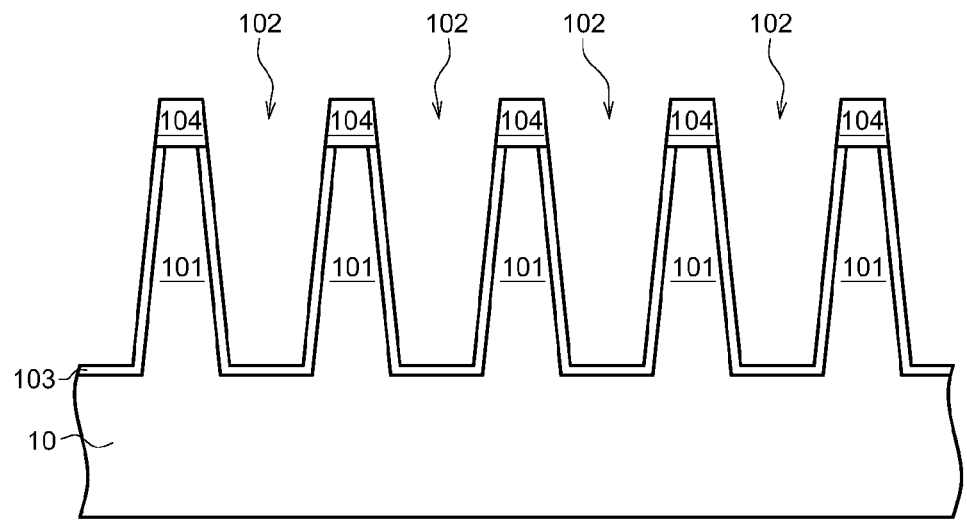
FIG. 1A to FIG. 1F illustrate a method for filling gaps of semiconductor device according to the first embodiment of the present disclosure.

In the embodiments of the present disclosure, a method for filling gaps of semiconductor device and a semiconductor device with insulation gaps formed by the same are provided. According to the embodiments, at least a nitride-containing layer formed on the protruding portions (such as fins for FinFET) of the silicon substrate followed by forming an amorphous silicon (a-Si) layer on the nitride-containing layer, thereby effectively preventing silicon consumption and the protruding portions from bending. The method of the present disclosure is simple, suitable for mass production, and can be applied to any semiconductor device having insulation gaps, particular the gaps with high aspect ratio. The FinFET devices having plural fins apart by gaps are exemplified for illustration. However, it is known by people skilled in the art that the method of the present disclosure is not limited to the FinFET gap-filling process, and could be applied to other processes for filling gaps of different types of the semiconductor devices.

Embodiments are provided hereinafter with reference to the accompanying drawings for describing the related procedures and configurations. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

First Embodiment

FIG. 1A to FIG. 1F illustrate a method for filling gaps of semiconductor device according to the first embodiment of the present disclosure. As shown in FIG. 1A, a silicon substrate 10 with plural protruding portions 101 is provided, and the protruding portions 101 are spaced apart from each other by the gaps 102 with predetermined depths. The gaps 102 are defined by etching the silicon substrate 10 through a patterned hard mask layer 104 on the silicon substrate 10. The patterned hard mask layer 104 can be a single layer such as a pad oxide, or a multi-layered stack such as an oxide/ nitride/oxide layer. An in-situ steam generation (hereinafter abbreviated as ISSG) oxidation can be optionally (not limitedly) performed to form an ISSG oxide 103 on the silicon substrate 10. Those gaps 102 can be trenches filled with isolation for forming the shallow trench isolations (STIs). Also, the protruding portions 101 defined by the gaps can be the fins of Fin Field effect transistors (FinFETs).

Figure 1B:
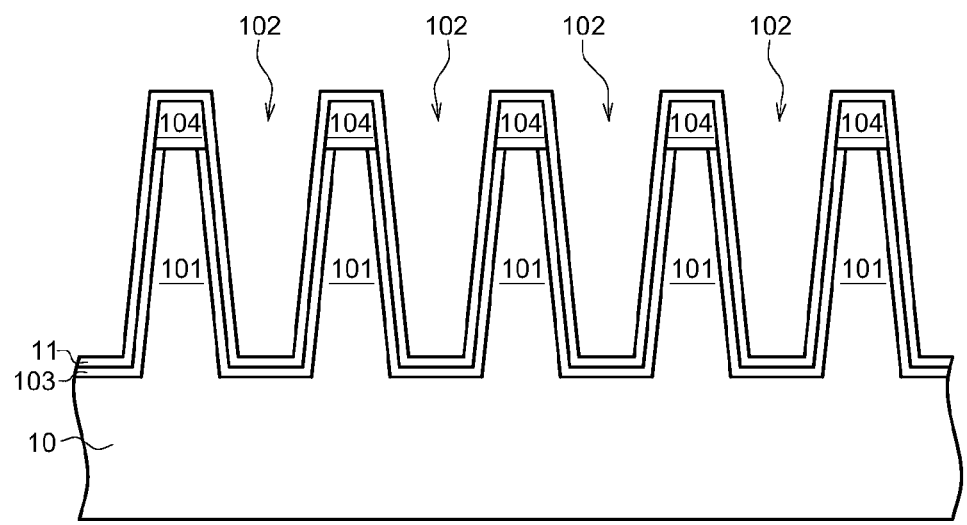
Figure 1C:
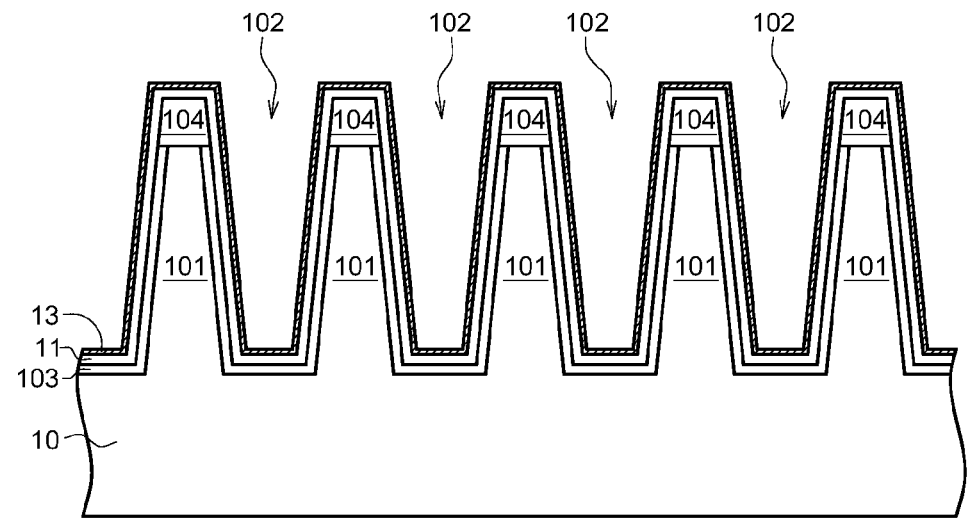

In the first embodiment, a liner oxide 11 is formed on the silicon substrate 10 for covering the protruding portions 101 and the surfaces of the gaps 102, as shown in FIG. 1B. In one embodiment, a high aspect ratio process (hereinafter abbreviated as HARP) can be conducted to form the liner oxide 11 on the silicon substrate 10.

Then, as shown in FIG. 10, a nitride-containing layer 13 is formed on the liner oxide 11 as a liner nitride. The nitride-containing layer 13, such as silicon oxynitride (SiON), can be formed on the liner oxide 11 by a nitridation process. The nitridation process can be carried out in an annealing furnace or a rapid thermal process (RTP) by using N2O, NO or NH3 as a source gas at the temperature in the range of about 650° C. to about 900° C. in order to form the liner nitride. In one embodiment, the nitridation process is carried out by using NH3 as a source gas at the temperature in the range of about 650° C. to about 900° C. Noted that the temperature and materials described herein are provided for illustration, not for limiting the scope of the disclosure.

Figure 1D:
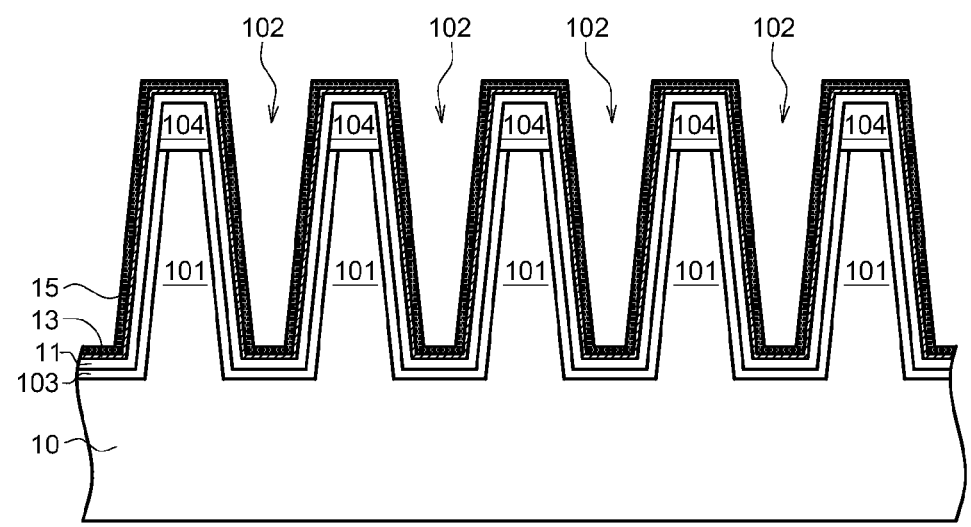

After nitridation, an amorphous silicon layer 15 is formed on the nitride-containing layer 13, as shown in FIG. 1D. A stress buffer film (hereinafter abbreviated as SBF) process can be performed to form the amorphous silicon layer 15 along the nitride-containing layer 13. The SBF process can be carried out at a temperature in a range of about 350° C. to about 550° C. to form the amorphous silicon layer 15. In one embodiment, the SBF process is carried out in a furnace at a temperature of about 380° C. to form the amorphous silicon layer 15. Also, in one embodiment, a thickness of the amorphous silicon layer 15 is about 40 Å.

Figure 1E:
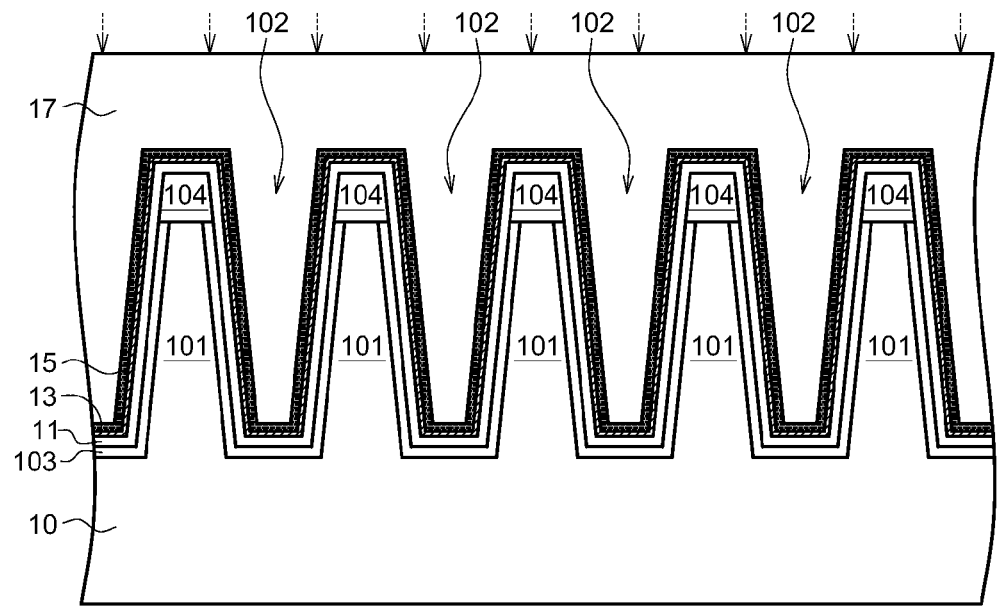
Figure 1F:
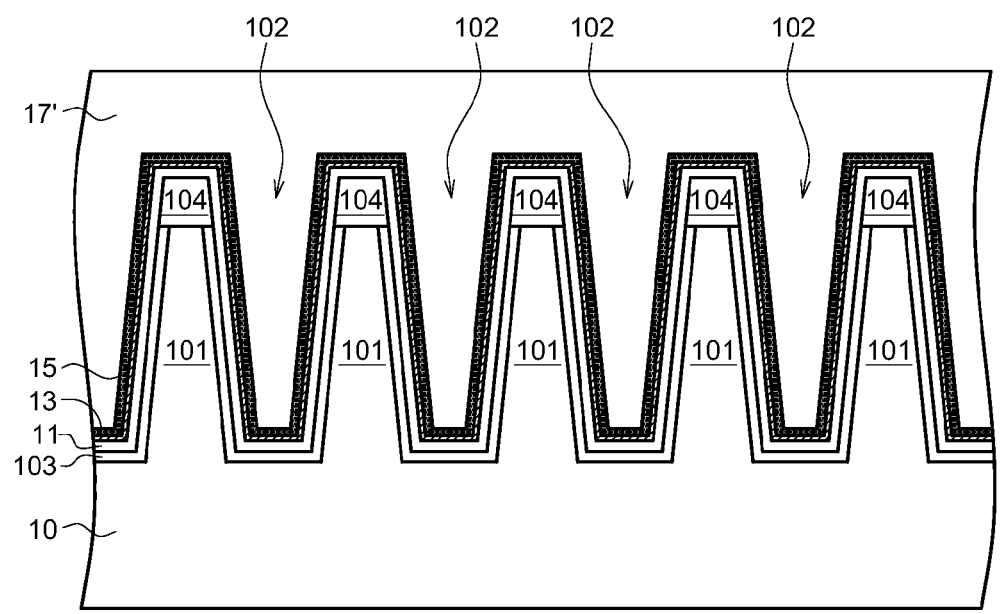

After forming the amorphous silicon layer 15, an insulating layer 17 is formed on the amorphous silicon layer 15, and the gaps 102 are filled up with the insulating layer 17, as shown in FIG. 1E. According to the embodiment having the gaps 102 with high aspect ratio, a flowable chemical vapor deposition (hereinafter abbreviated as FCVD) can be performed to form the insulating layer 17 (comprising insulating material such as SiO2) on the amorphous silicon layer 15 and filling up the gaps 102. Then, a densification process is performed to solidify and strengthen the insulating layer 17 to form a solidified insulating layer 17' (FIG. 1F). The densification process could be, but not limited to, a steam thermal condition (FIG. 1E). For example, the densification process can be performed in a high temperature anneal under an oxygen-containing environment.

After FCVD and densification, other processes required in the applications such as planarization process performed for planarizing the densified insulating layer 17' can be conducted, and the details are well known to people skilled in the art and thus not described herein. The disclosure has no particular limitations to the subsequent processes.

Second Embodiment

FIG. 2A to FIG. 2D illustrate a method for filling gaps of semiconductor device according to the second embodiment of the present disclosure. The major difference between the first and second embodiments is the elimination of the liner oxide. In the second embodiment, the liner oxide can be omitted.

Figure 2A:
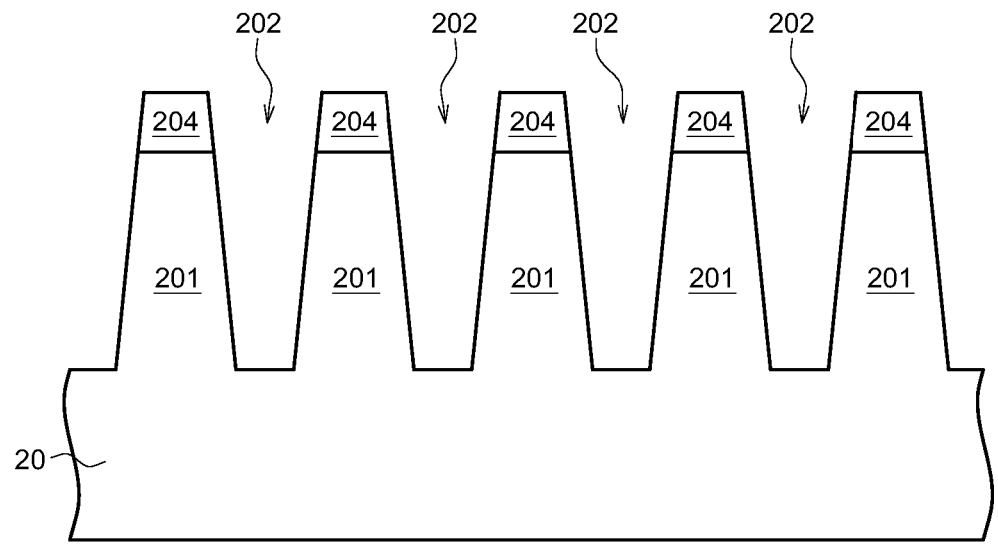
FIG. 2A to FIG. 2D illustrate a method for filling gaps of semiconductor device according to the second embodiment of the present disclosure.
Figure 2B:
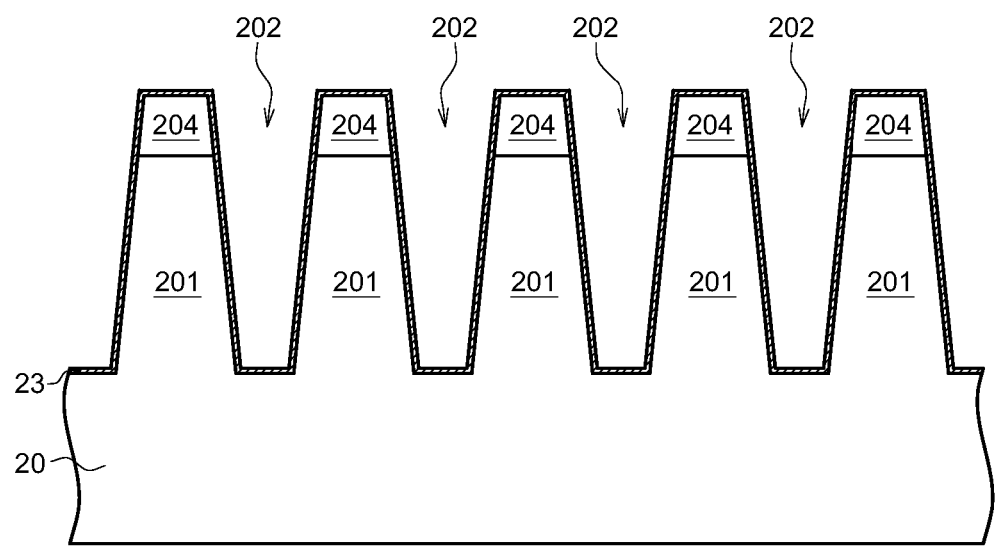
Figure 2C:
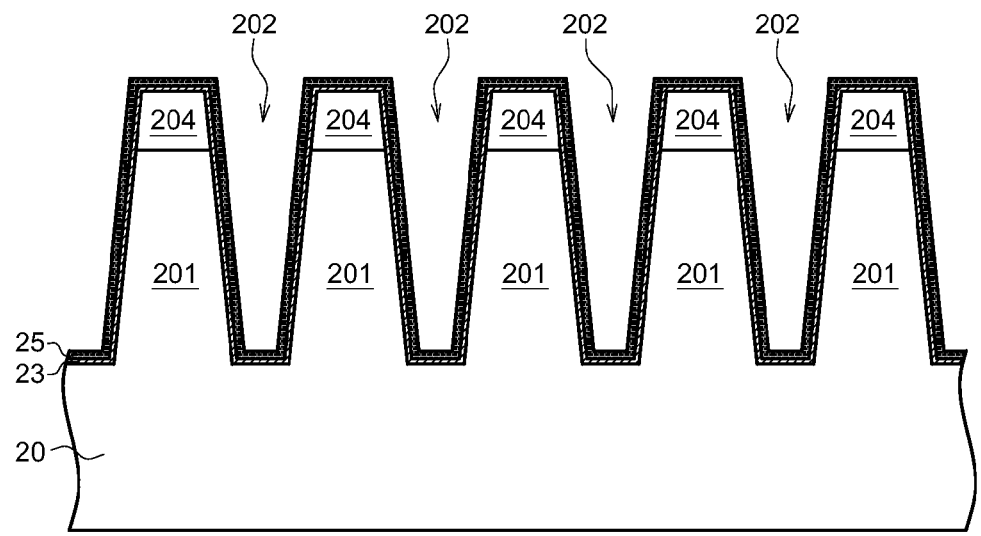
Figure 2D:
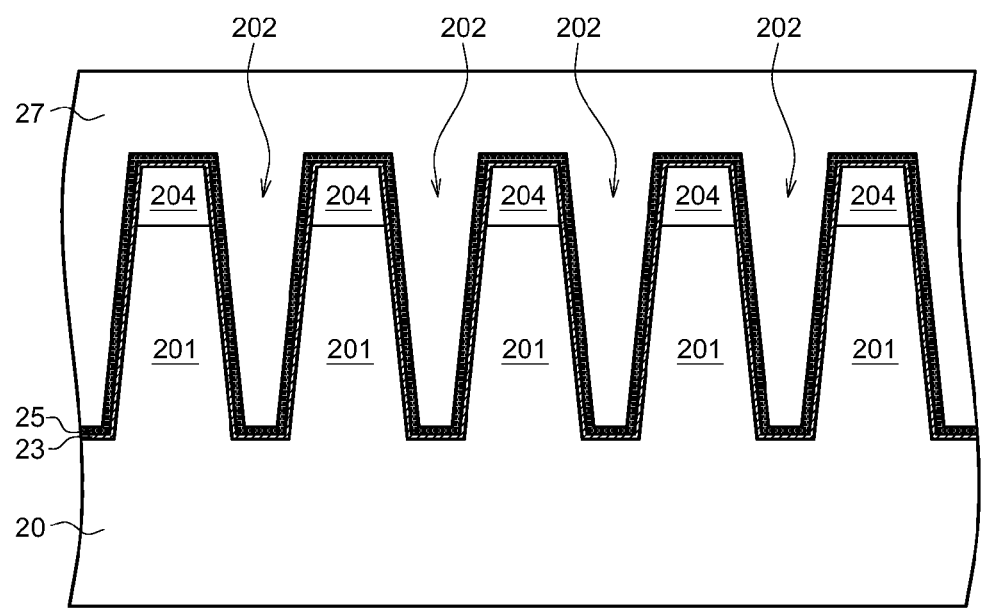

As shown in FIG. 2A, a silicon substrate 20 with plural protruding portions 201 is provided, and the protruding portions 201 are spaced apart from each other by the gaps 202 with predetermined depths. Similarly, the gaps 202 are defined by etching the silicon substrate 20 through a patterned hard mask layer 204 on the silicon substrate 20. In the second embodiment, the silicon substrate 20 with the gaps 202 is subjected to the nitridation process to form a nitride-containing layer 23 such as silicon nitrite (SiN), as shown in FIG. 2B. Similar to the steps of the first embodiment, an amorphous silicon layer 25 is subsequently formed on the nitride-containing layer 23 (ex: SiN) by a SBF process after nitridation, as shown in FIG. 2C. Then, after forming the amorphous silicon layer 25, an insulating layer 27 is formed on the amorphous silicon layer 25, such as by a flowable chemical vapor deposition (FCVD) followed by a densification process (to solidify and strengthen the insulating layer 27), wherein the gaps 202 are filled up with the insulating layer 27, as shown in FIG. 2D. Please refer to the first embodiment for the details of the processes, which are not redundantly described herein.

According to the embodiments, the nitride-containing layer may comprise silicon oxynitride (SiON) at least formed along the liner oxide 11 as described in the first embodiment, or silicon nitride (SiN) at least formed along the gaps 202 as described in the second embodiment, depending on the materials subjected to the densification. The nitride-containing layer 13/23 of the embodiments possesses at least the advantages of stopping oxygen penetration effectively and functioning as a "restraining frame" on the protruding portions 101/201 of the silicon substrate 10/20.

During the manufacturing processes such as densification of the insulating layer 17/27, oxygen may penetrate into the insulating layer, even into the layers underneath the insulating layer 17/27. According to the embodiments, the nitride-containing layer 13/23 could be (but not limited to) silicon oxynitride (SiON) in the first embodiment or silicon nitride (SiN) in the second embodiment, which plays an important role (i.e. functions as a barrier) to stop the oxygen penetration, so that the defects of silicon consumption of silicon substrate 10/20 can be effectively prevented.

Also, according to the embodiments, the silicon substrate 10/20 is separated from the insulating layer 17/27 at least by the nitride-containing layer 13/23 and the amorphous silicon layer 15/25. The amorphous silicon layer 15/25 formed on the nitride-containing layer 13/23 is able to provide silicon to react with penetrating oxygen. If oxygen of densification penetrates the insulating layer 17/27 during high-temperature annealing (such as steam thermal for solidifying the insulating layer 17/27), the amorphous silicon layer 15/25 functions as a first barrier for being consumed. Even the amorphous silicon layer 15/25 is severely consumed and oxygen continues to penetrate into the layer underneath, the nitride-containing layer 13/23 (ex: SiON or SiN) between the silicon substrate 10/20 and the amorphous silicon layer 15/25 provides a sustainable and sufficient barrier for stopping the oxygen penetration and preventing silicon consumption of the silicon substrate 10/20. Therefore, the nitride-containing layer 13/23 functions as a second barrier to protect the silicon substrate 10/20.

Moreover, although the insulating layer 17/27 formed by FCVD is solidified and strengthened by a densification process, stress would be generated during the densification process. In the conventional process, the device having fins spaced by the gaps, especially the gaps with high aspect ratio, typically suffers from the fin bending issue, especially the fins positioned closer to the edges of the fin region. According to the embodiments, the silicon substrate 10/20 with the protruding portions 101/201 is covered by the multiple layers at least comprising the nitride-containing layer 13/23 and the amorphous silicon layer 15/25, and the multiple layers are conformal with the protruding portions 101/201 and the gaps 102/202 of the silicon substrate 10/20. The nitride-containing layer 13/23 of the embodiments, such as silicon oxynitride (SiON) in the first embodiment or silicon nitride (SiN) in the second embodiment, formed as a liner nitride is able to restrain the configuration of the protruding portions from bending or tilting during manufacturing process, thereby preventing the bending defects in the protruding portions (ex fin bending/tilting). The semiconductor devices having fins with high aspect ratio have benefited from the embodiments of the disclosure.

According to the aforementioned descriptions, the methods of the embodiments and the semiconductor devices formed by the same possess several advantages; for example, the amorphous silicon layer and/or the nitride-containing layer stop oxygen penetration, thereby effectively preventing silicon consumption. Also, the nitride-containing layer formed as a liner nitride functions as a "restraining frame" on the protruding portions of the substrate (such as fins for FinFET), thereby preventing fins from bending. The electrical characteristics and lifespan of the products applied with the devices of the embodiment can be significantly improved. Accordingly, the products applied with the embodied structure possess high competitiveness in the commercial market. Moreover, the methods of the embodiments are simple to perform and compatible with current process, which are feasible and suitable for mass production.

Other embodiments with different configurations such as patterns of the ISSG oxide 103, the liner oxide 11, the nitride-containing layer 13/23 and the amorphous silicon layers 15/25 can be applicable, and the variations depend on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for filling gaps of semiconductor device, comprising:
   providing a silicon substrate with plural protruding portions, and the protruding portions spaced apart from each other by gaps with predetermined depths;
   forming a nitride-containing layer above the silicon substrate for covering top surfaces and sidewalls of the protruding portions and surfaces of the gaps as a liner nitride;
   forming an amorphous silicon layer directly and conformably on the nitride-containing layer; and
   forming an insulating layer on the amorphous silicon layer, and the gaps filled up with the insulating layer, wherein the nitride-containing layer is separated from the insulating layer by the amorphous silicon layer.

2. The method according to claim 1, wherein the nitride-containing layer is formed by a nitridation process.

3. The method according to claim 2, wherein the nitridation process is carried out at a temperature in a range of about 650° C. to about 900° C.

4. The method according to claim 1, wherein the amorphous silicon layer is formed on the nitride-containing layer by a stress buffer film (SBF) process.

5. The method according to claim 4, wherein the SBF process is carried out at a temperature in a range of about 350° C. to about 550° C. to form the amorphous silicon layer.

6. The method according to claim 1, wherein a thickness of the amorphous silicon layer is about 40 Å.

7. The method according to claim 1, wherein the insulating layer is formed by a flowable chemical vapor deposition (FCVD) process for filling up the gaps.

8. The method according to claim 1, wherein the step of forming the insulating layer and filling the gaps further comprises:
   performing a densification process to solidify and strengthen the insulating layer.

9. The method according to claim 8, wherein the densification process is carried out by a steam annealing.

10. The method according to claim 1, further comprising forming a liner oxide on the silicon substrate for covering the protruding portions and the surfaces of the gaps, wherein the nitride-containing layer is formed on the liner oxide as the liner nitride.

11. The method according to claim 10, wherein the nitride-containing layer comprises silicon oxynitride (SiON) at least formed along the liner oxide.

12. The method according to claim 1, wherein the nitride-containing layer comprises silicon nitride (SiN) at least formed along the gaps.

13. The method according to claim 1, wherein the silicon substrate with the protruding portions is covered by multiple layers at least comprising the nitride-containing layer and the amorphous silicon layer, and the multiple layers are conformal with the protruding portions and the gaps of the silicon substrate.

* * * * *